(12) United States Patent
Hilton (10) Patent No.: US 6,859,541 B1
(45) Date of Patent: Feb. 22, 2005

(54) VOLUME CONTROL PEDAL

(76) Inventor: Keith L. Hilton, 615 Shary View Rd., Branson, MO (US) 65616

( * ) Notice: Subject to any disclaimer, the term of this patent is extended or adjusted under 35 U.S.C. 154(b) by 710 days.

(21) Appl. No.: 09/849,444

(22) Filed: May 4, 2001

Related U.S. Application Data (60) Provisional application No. 60/202,287, filed on May 5, 2000.

(51) Int. Cl.[7] .................................................. H03G 3/00
(52) U.S. Cl. ........................................ 381/104; 381/109
(58) Field of Search ................................ 381/104, 105, 381/109, 118; 84/746, 721

(56) References Cited

U.S. PATENT DOCUMENTS

| | | | | |
|---|---|---|---|---|
| 5,274,710 A | * | 12/1993 | Shaffer et al. ............... | 381/109 |
| 5,659,145 A | * | 8/1997 | Weil .......................... | 84/464 R |
| 6,318,208 B1 | * | 11/2001 | Thongs et al. ................ | 74/513 |
| 6,548,749 B2 | * | 4/2003 | Suda .......................... | 381/104 |
| 6,724,897 B1 | * | 4/2004 | Smith ........................ | 381/104 |

* cited by examiner

Primary Examiner—Stella Woo
(74) Attorney, Agent, or Firm—Jonathan A. Bay (57) ABSTRACT

A volume control pedal has an opposed emitter and receiver which are set up to establish an emission path therebetween. A shade is provided to intersect the emission path. Pedal operation induces relative displacement between the shade and emission that as a result varies the emission reception such that the receiver's output provides a control variable for volume control. The shade has a varying regions of light and dark as rendered by an image of a varying dot density pattern. This allows among other things producing the image by a computer-implemented process, as well as printing it on transparent stock such as optionally on a negative film by a film developing process.

20 Claims, 7 Drawing Sheets

VOLUME CONTROL PEDAL

CROSS-REFERENCE TO PROVISIONAL APPLICATION(S)

This application claims the benefit of U.S. Provisional Application No. 60/202,287, filed May 5, 2000.

BACKGROUND OF THE INVENTION

1. Field of the Invention

The invention relates to a volume control pedal for musicians and more particularly relates to the pedal's circuitry as well as aspects of the mechanical construction in view of such circuitry.

2. Prior Art

Pedals for volume control are popular with performing musicians, whether vocalists or instrumentalists performing on, by way of non-limiting example, guitars, steel guitars, fiddles and so on. Volume control pedals are popular despite if a sound control engineer is involved. Musicians simply desire independent control of boosting or fading their performance at times when the feeling is there and in order to achieve certain effects.

Prior art volume control pedals have characteristically relied on potentiometers such as pulley-spun dial-type potentiometers for voltage control. It is an object of the invention to provide a distinctive alternative to potentiometers, dial- or plunger-type or otherwise, in a volume control pedal.

Eliminating potentiometers in favor of a better alternative is advantageous because the price of audio-quality potentiometers has increased dramatically over the years concurrently as quality has apparently gone down. Audio product manufacturers find that keeping an on-hand stock in sufficient quantities of a diverse assortment of different potentiometers of premium quality is an expensive investment. Every year the problem is exacerbated by rising costs, discontinued product lines, and the gradual cheapening of quality. In audio work, even slight changes in quality produce discernible problems in the final audio output.

Potentiometers are categorized according to many characteristics including what is sometimes known as taper. For instance there are potentiometers offered not only with linear or "audio" taper but also various logarithmic tapers. However the inventor hereof finds that the logarithmic-taper potentiometers he has experimented were undesirably inconsistent. Volume control pedals commonly use 500,00 ohm potentiometers made of hot molded carbon. The least imperfection causes problems that can be heard in the final audio output. Just as problematical, an audio equipment manufacturer can only obtain whichever taper profiles that potentiometer OEM's offer off-the-shelf unless the manufacturer is so large it can afford to order custom potentiometers. Regardless, the selection of potentiometers is fairly limited to a finite number of different products.

Since the 1960's the prior art has seen a series of "light beam" pedals, or pedals which used "light beam" circuits to control signal voltage. In the professional music world these light beam pedals had a sour reputation. There were at least three well-known problems with them:—they lost high-end frequency, they would often not go all the way OFF, and they didn't rock very comfortably underfoot.

The inventor hereof examined at least three varieties of these 1960's light beam pedals and discovered the following. The electronics inside all used a photo-resistor arrangement. These kinds of photo-resistors are sometimes called Cds cells. The light beam source in all instances was an incandescent light. The control over light intensity that shined on the photo-resistor was accomplished in one of three ways which in common shared the principle of the stroke of a shutter. The simplest way involved the simple eclipse of the light source by an opaque shutter. Full retraction of the shutter corresponded to full transmissivity of the light as full extension corresponded to full blockage, with varying degrees of transmissivity corresponding to intermediate positions accordingly. A second way used graduated material thickness in which a dark plastic wedge-shaped shutter's material thickness attenuated the light beam. That is, the thinner portions of the wedge corresponded to more transmissivity of the light beam as the thicker portions corresponded to more blockage. The third way had an opaque shutter that was formed with an elongated V-shaped slit. The width at the top of the V-shaped slit corresponded to maximum transmissivity of light as the vertex at the bottom of the V-shaped slit reached the point of full blockage.

The problems of the prior art light beam pedals were discovered to be arguably attributable to the following. As for loss of high end frequency, evidently the prior art light beam control circuits presented a music instrument having a magnetic pickup with a low-impedance output when the magnetic pickup needed to see a high impedance output in order to preserve the high end frequencies. The failure to go to full OFF appeared to be due to leakage of ambient light onto the photo-resistors. And the unnatural feel of the light beam foot pedals seemed to be caused by the absence of inherent drag as in dial-type potentiometers. Although there is no felt drag or friction between a shutter and light beam, the drag that the prior art light beam pedals introduced by way of springs still felt unnatural underfoot. In the absence of drag, the treadle was free to sink to full ON or OFF if the musician lifted his foot. However the drag that was introduced were simple spring arrangements which biased the treadle to a given "HOME" position nevertheless. The spring arrangements of the prior art failed to adequately balance the treadle in the position chosen for the moment by the musician (if he pulled his foot off). Moreover the springs could require a constant fight underfoot and did not shift and glide through or hold positions like pulley-spun dial-type potentiometer pedals.

These and other problems have plagued the prior art light beam pedals out of disfavor and virtual disuse, not all of which problems were likely discovered by the studies of the inventor hereof. What is needed is a solution which eliminates potentiometers in a volume control pedal without re-incorporating the problems associated with prior art light beam pedals.

SUMMARY OF THE INVENTION

It is an object of the invention to provide a volume control pedal with a way of achieving volume control that is distinctive over the prior art way characterized by potentiometers as typically a pulley-spun dial-type potentiometer.

It is an alternate object of the invention to that the foregoing volume control pedal overcome the disadvantages associated with the prior art pedals as discussed above in the Background section.

It is another object of the invention to provide a control shade for a light-beam volume control circuit that is producible by a computer-implemented imaging process and which can then be printed or developed on a transparent sheet.

It is an additional object of the invention to provide a mechanical arrangement for holding the control shade in position at times when the user takes his foot off the pedal.

It is a further object of the invention to introduce a pre-amp between an audio instrument's magnetic pickup and the inventive light-beam control circuit in order to present the magnetic pickup with a high impedance output and thereby better preserve the high end frequencies in the audio signal.

These and other aspects and objects are provided according to the invention in a volume control pedal having a proportionate control system which operates on the variance of relative transmissivity sensed by a radiation collector. In an example embodiment of the invention, the radiation source optionally comprises an infrared light-emitting diode which preferably is powered to give a constant output. The emission sensor or collector optionally comprises an infrared/photo-transistor although alternatively a photo-diode works as well, and a photo-resistor presents another option still. The way in which the relative transmissivity received-by-the-sensor or -collector is adjusted preferably comprises the following:—eg., the relative displacement of a shade having varying regions of light and dark. For example, the shade may be provided with regions having at one extreme a region which is nearly fully transparent as opposed to another region which is nearly fully opaque, and including having a gradually changing grey scale extending between and smoothly merging the opposed regions.

Additional aspects and objects of the invention will be apparent in connection with the discussion further below of preferred embodiments and examples.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
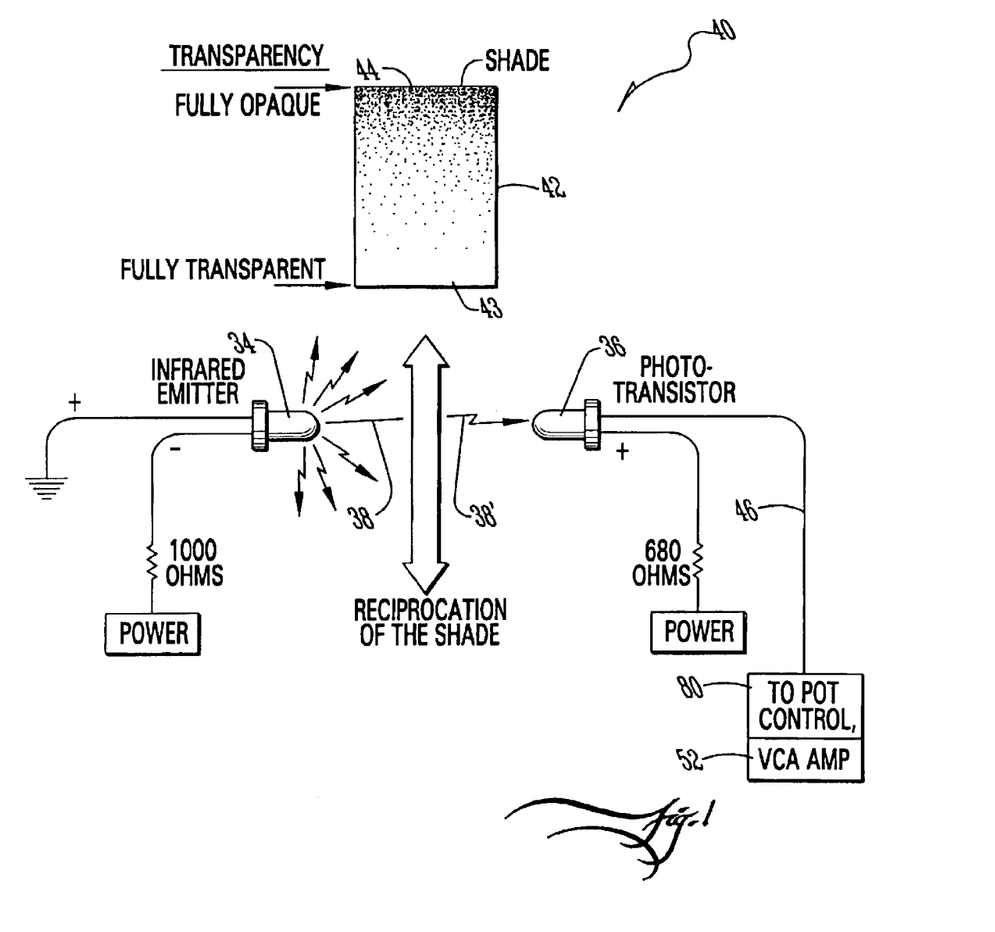
FIG. 1 is a diagrammatic view of a control signal system for feeding to an amplifier circuit in a volume control pedal in accordance with the invention.
Figure 2:
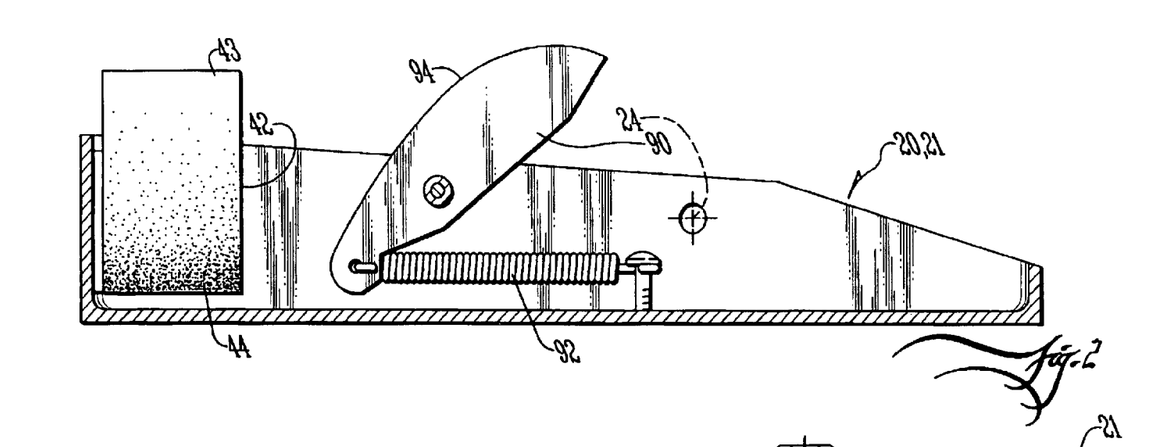
FIG. 2 is a section view taken along line II—II in FIG. 3 of the inventive volume control pedal's lower half or base portion.
Figure 4:
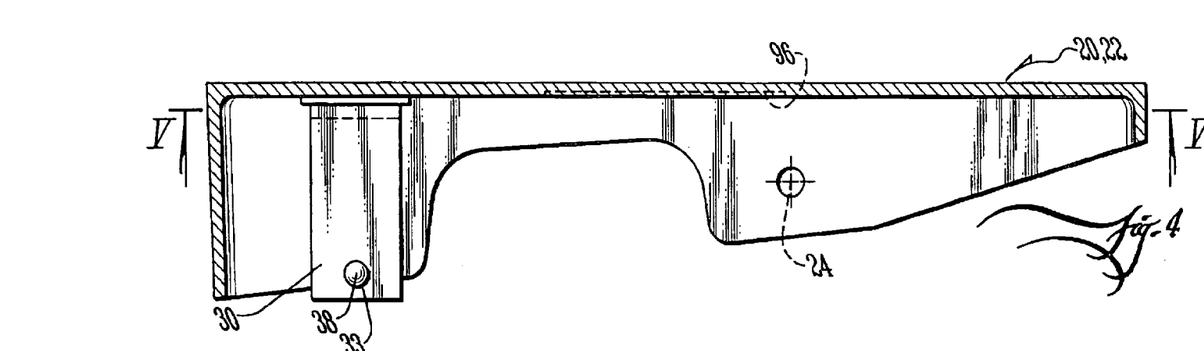
FIG. 4 is a section view taken along line IV—IV in FIG. 5 of the inventive volume control pedal's upper half or rocking treadle portion.

FIG. 1 shows a control signal system 40 in accordance with the invention for a volume control pedal 20 in accordance with the invention. The clam-shell housing 21,22 of the volume control pedal 20 is shown in separate halves 21 and 22 by FIGS. 2 and 4. In FIG. 2, it shows the base half 21 that sets on the floor. FIG. 4 shows the upper or rocking treadle portion 22. The rocking treadle 22 and base 21 connect by a pivot pin (not shown) that extends through the respective pin apertures along the rocking axis 24 of the treadle 22.

The base 21 carries a plastic mounting bracket 26 which in one example version of the invention is produced from transparent acetate. The flange 27 of the bracket 26 is fastened to a wall of the base 21. The stem 28 of the bracket 26 provides a mounting surface for a polyester film or "shade" 42 which will be more particularly described below. The treadle 22 carries an inverted U-shaped mounting block 30 that has arms 32 which extend down to lower terminations formed with apertures 33 for mounting matching emitter and collector (or sensor) devices 34 and 36 as follows. FIG. 1 shows the matching emitter 34 and collector 36 devices to comprise an infrared radiation-emitting diode 34 and an infrared/photo-transistor 36, respectively. The infrared radiation-emitting diode 34 and infrared/photo-transistor 36 are potted opposite each other across the gap 39 of the opposite arms 32 of the inverted U-shaped mounting block 30. The opposite positions of the emitter 34 and sensor 36 define a light axis 38 between each other. Preferably the sensor 36 is chosen from one of a photo-transistor or photo-diode, although a photo-resistor offers a further option.

The emitter device 34 is preferably chosen for providing a high intensity radiation source. In the preferred example the inventor has chosen a very high intensity light-emitting diode (LED) for the emitter 34, and then has arranged the shade 42 and collector 36 such as photo-transistors or photo-diodes in accordance with this high intensity LED source. The use of a high intensity source 34 in contrast to the prior art incandescent-light sources provides multiple advantages. The use of a high intensity light source preserves the premium quality of the audio output better, which may be due in significant part to the incorporation of the high intensity device 34. The high intensity device 34 also eliminates the problem of leakage of ambient light onto the collector or sensor 36. Use of the high intensity device 34 obtains full OFF even when used in outdoor daylight settings. The photo-transistor (or photo-diode or the like) sensor 36 is arranged in connection with this high intensity source such that the low intensity of background ambient light appears not to operate or otherwise degrade the sensor's sensitivity to the high intensity source. Additionally the emitter and sensor devices 34 and 36 preferably operate in the infrared, which further seems to reduce the deleterious effects on the sensor 36's sensitivity to ambient light leakage into the foot pedal 20's housing.

When the base 21 and treadle 22 are assembled together (not shown), the shade 42 (fixed to the base 21) fits in the gap 39 between the arms 32 of the inverted U-shaped mounting block 30 (fixed to the treadle 22). In use, a musician rests his or her foot on the treadle 22 to rock it to any position between extremes of fully depressed (toe down, heel up) or fully retracted (toe up, heel down). Rocking the treadle 22 causes relative displacement between the light axis 38 and shade 42. FIG. 2 shows that the shade 42 remains stationary relative to the floor. Hence when the treadle 22 is rocked from one position to a successive position, the light axis 38 is in fact moved relative to the stationary shade 42. The shade 42 and light axis 38 are arranged as shown on the base 21 and treadle 22 respectively for convenience of this description and do not limit the invention to this arrangement only because, the arrangement could be made any alternative way to achieve relative displacement of the shade 42 and light axis 38.

Referring more closely to FIG. 2, by way of a non-limiting example, the shade 42 varies gradually from a fully transparent upper border 43 to a fully opaque lower border 44. Given this non-limiting example as shown by the drawing(s), when the treadle 22 is fully depressed (toe down, heel up), the light axis 38 aligns in or near the fully opaque region 44 at the lower margin. Conversely, when the treadle 22 is fully retracted (toe up, heel down), the light axis 38 aligns in or near the fully transparent region 43 at the upper margin.

Briefly stated for now, control signal 46's adjustment and consequent control over volume or loudness is achieved by the relative displacement between the light axis 38 and shade 42. The amplifier circuitry 50 which will be more particularly disclosed in connection with FIG. 6 incorporates a voltage-controlled-amplifier chip 52. By inputting to the voltage-controlled-amplifier chip 52 an adjustable control signal 46, this allows adjustment to the amplifier chip 52's output strength. Causing changes in such a control signal 46 is achieved by the control signal system 40 shown by FIG. 1.

Figure 7A:
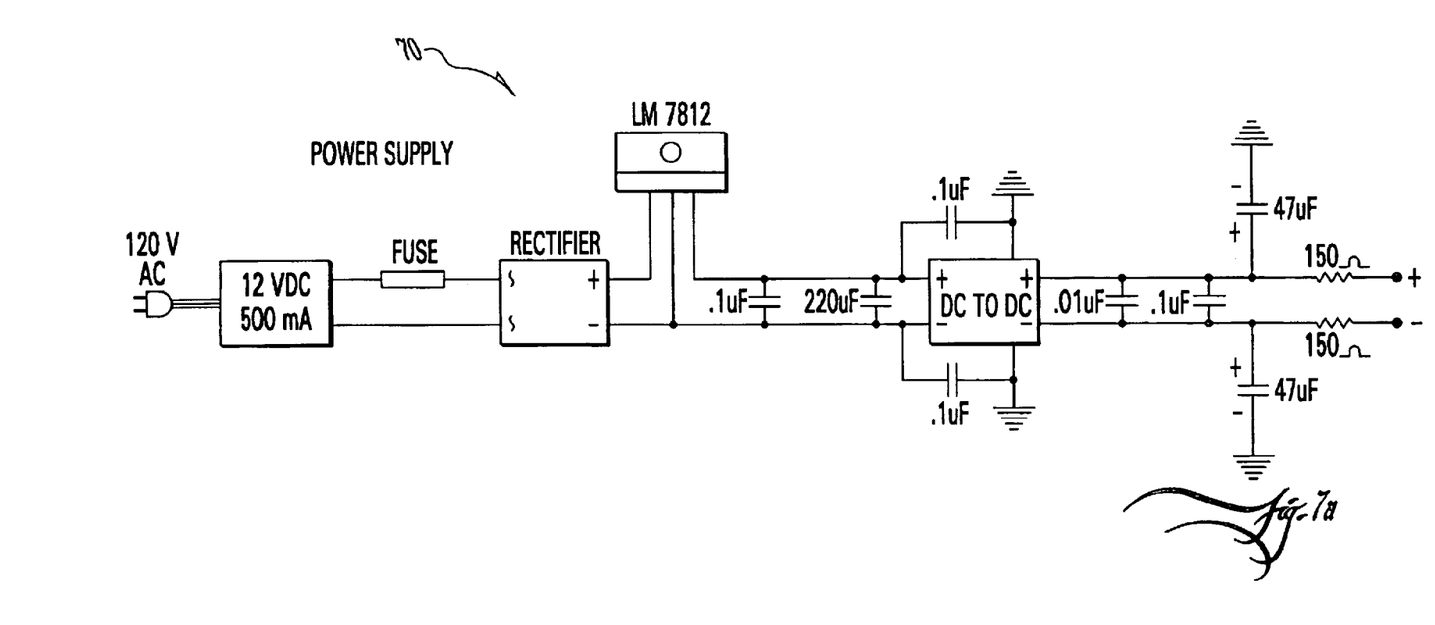
FIG. 7a is a schematic circuit diagram of a power supply circuit for the volume control pedal in accordance with the invention.
Figure 7B:
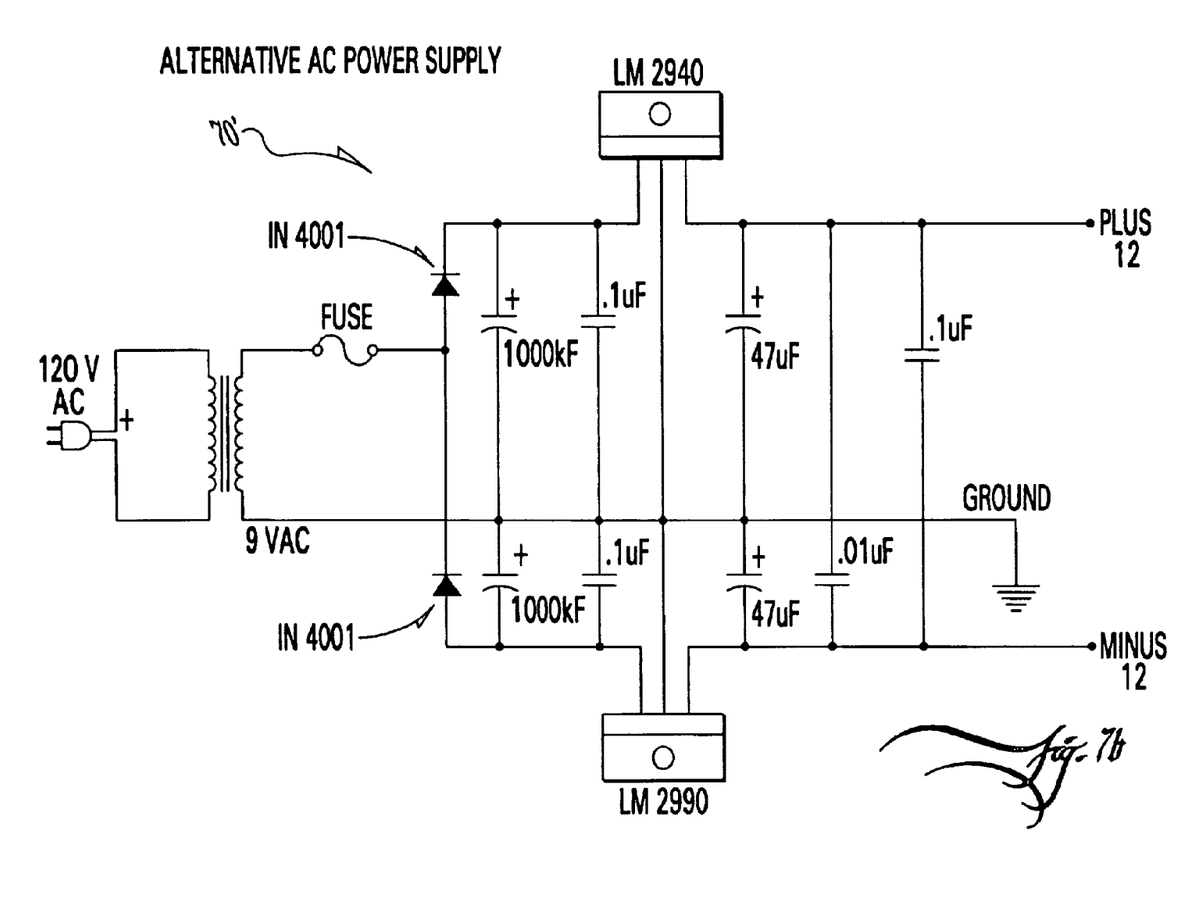
FIG. 7b is a schematic circuit diagram of an alternative power supply circuit for the volume control pedal in accordance with the invention; and, FIG. 8 is a schematic circuit diagram of dual potentiometer circuit(s) for the volume control pedal in accordance with the invention.

Referring to FIG. 1, the infrared emitter 34 is aimed at the photo-transistor 36 such that the given transmission beam 38 is established. The infrared emitter 34 provides an emission output at a constant value. The constant value of the emission output is a function of the power supply feed 70/70' as shown by FIGS. 7a and/or 7b and described more particularly below. The photo-transistor 36 receives a portion of the emission output as shown and indicated as the light axis or alternatively the transmission beam 38. The relative strength of the received signal 38' is reckoned as 100% transmissivity when there is no external attenuation or "shading" of the emission 'received' 38' from the emitter. The shade 42 allows scaled changes in the transmissivity of the 'received' emission 38' from values corresponding to about 100% transmissivity for fully transparent regions 43 of the shade 42, to about 0% (zero percent) transmissivity for fully opaque regions 44 of the shade 42. More simply, the more emission 38' passed through the shade 42, the more of its power or intensity that reaches the photo-transistor 36. The less emission 38' passed through the shade 42, the less of its power or intensity that reaches the photo-transistor 36.

The photo-transistor 36 conducts in proportion to the emission (or radiation predominantly in an IR band) power 38' it receives. Hence, the more emission 38' passed through the shade 42, the more the photo-transistor 36 conducts. Conversely, the less emission 38' passed through the shade 42, the less the photo-transistor 36 conducts. The output of the photo-transistor 36 is the control signal 46 for the voltage-controlled-amplifier chip 52 of FIG. 6. As a result, causing changes in the output 46 of the photo-transistor 36 ultimately allows volume adjustment of the voltage-controlled-amplifier chip 52's output audio signal 62.

The shade 42 is produced with varying light and dark regions of grey tones on a polyester camera film. In fact, the grey scale is achieved by varying the dot density of a dot matrix printed on the film. As shown by FIG. 1, the dot density on the shade increases from virtually nil at the lower transparent border 43 to virtually opaque at the upper opaque border 44.

It is an inventive aspect that the gradation of the dot density can be arranged in accordance with a definite mathematical formula. This in turn determines a performance feature of the volume control pedal 20 as measured by in what way the volume is controlled relative to movement of the treadle 22. The gradations can be smooth or not (eg., discontinuous). At least smooth gradations can be established as linear or non-linear, wherein one of the more popular non-linear gradations has a logarithmic profile or the like. In fact, the gradations can be given any infinite variety of an arrangement as desired. Again, any arrangement in the gradations of the grey scale can be associated with the relative displacement between the shade 42 and light axis 38.

The preferred method of establishing a grey scale on the shade 42 is achieved by computer imaging. Among other things, this allows arranging the gradations in the grey scale in accordance with a prescribed mathematical formula. The computer imaging systems employed by the inventor hereof in producing the proof-of-concept prototypes were those used to grey-tone pictures for printing newspapers photos. For newspapers, printed black-and-white photos are typically resolved from a computer-image rendered in a dot matrix. Such a dot matrix being so imaged by a computer can be printed or "developed" on camera film.

To date the inventor has produced shades 42 measuring 1-¾ inches high (4.5 cm) in strips of between about 1 to 1-½ inches wide or so (eg., 2.5 to 3.8 cm) out of sheet film stock measuring full page size (ie., double ledger or 17 inches by 21 inches (43 cm by 53 cm)). An example of pseudo-code for generating such a computer-imaged sheet of film would recite as follows:

Gradient angle→90°.
Horizontal bars→1-¾ inches.
Bar height→1-⅝ inches.
Bar width→1-⁴⁵⁄₆₄ inches.
Dot pattern→diamond, 1600 dpi, 90% highlight.

Figure 3:
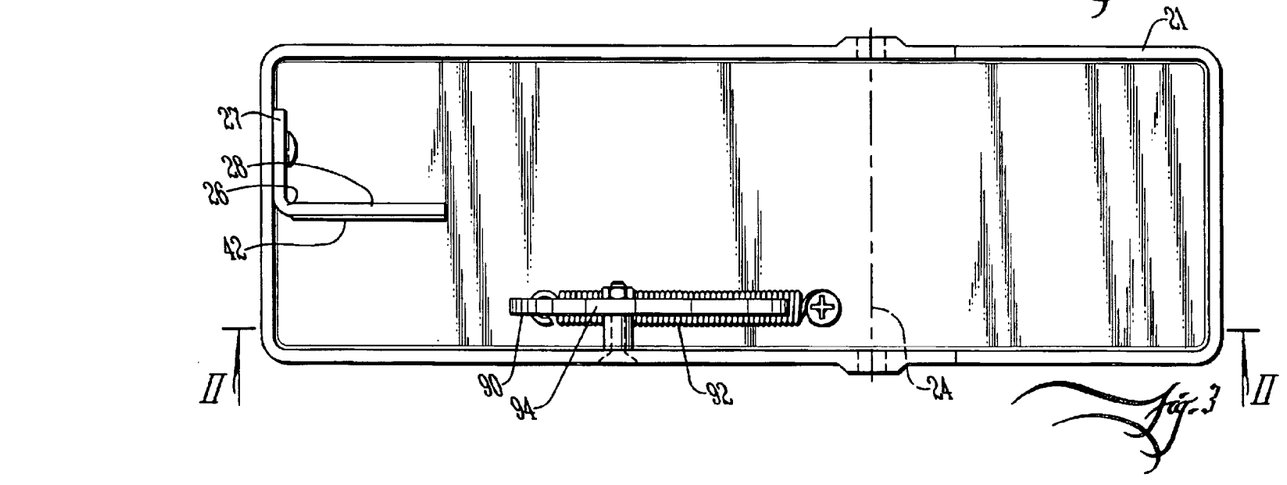
FIG. 3 is a top plan view thereof.

Any suitable film type will suffice including for example the polyester-base negative films of Anitec or alternatively Safelight's Encapsulite R20 (Red) and like 0.004 inch (0.10 mm) polyester-base equivalents. Individual shades 42 are cut to size and to date, simply hot glued to the acetate mounting bracket 26 (see, eg., FIGS. 2 and 3).

Given the foregoing, the transmission axis 38 between the emitter 34 and photo-transistor 36 is established vis-a-vis the emitter's and collector's 34 and 36 opposed mountings in the arms 32 of the inverted U-block 30 hanging from the treadle 22. The base 21 and treadle 22 are pivoted such that rocking the treadle 22 traces the transmission axis 38 up or down on the shade 42. Moving the transmission axis 38 down to a region of greater grey shading 44 or up to regions of lesser shading 43 correspondingly results in greater or lesser proportions of the transmissivity 38' being blocked by the shade 42. Greater or lesser blocking of the transmissivity 38' to the photo-transistor 36 results in lesser or greater proportions of the control signal 46 being fed into to the voltage-controlled-amplifier chip 52, which in turn causes the audio output volume 62 to be turned down or up respectively. Whereas the immediately preceding description comprises one example description of a scheme of control 40, persons having routine skill in the art might alternatively utilize inverted circuit devices in which one or more of the above-described relationships would constitute inverse relationships, and in which case other devices would be correspondingly inverted (or not) to achieve the desired overall result.

Figure 6:
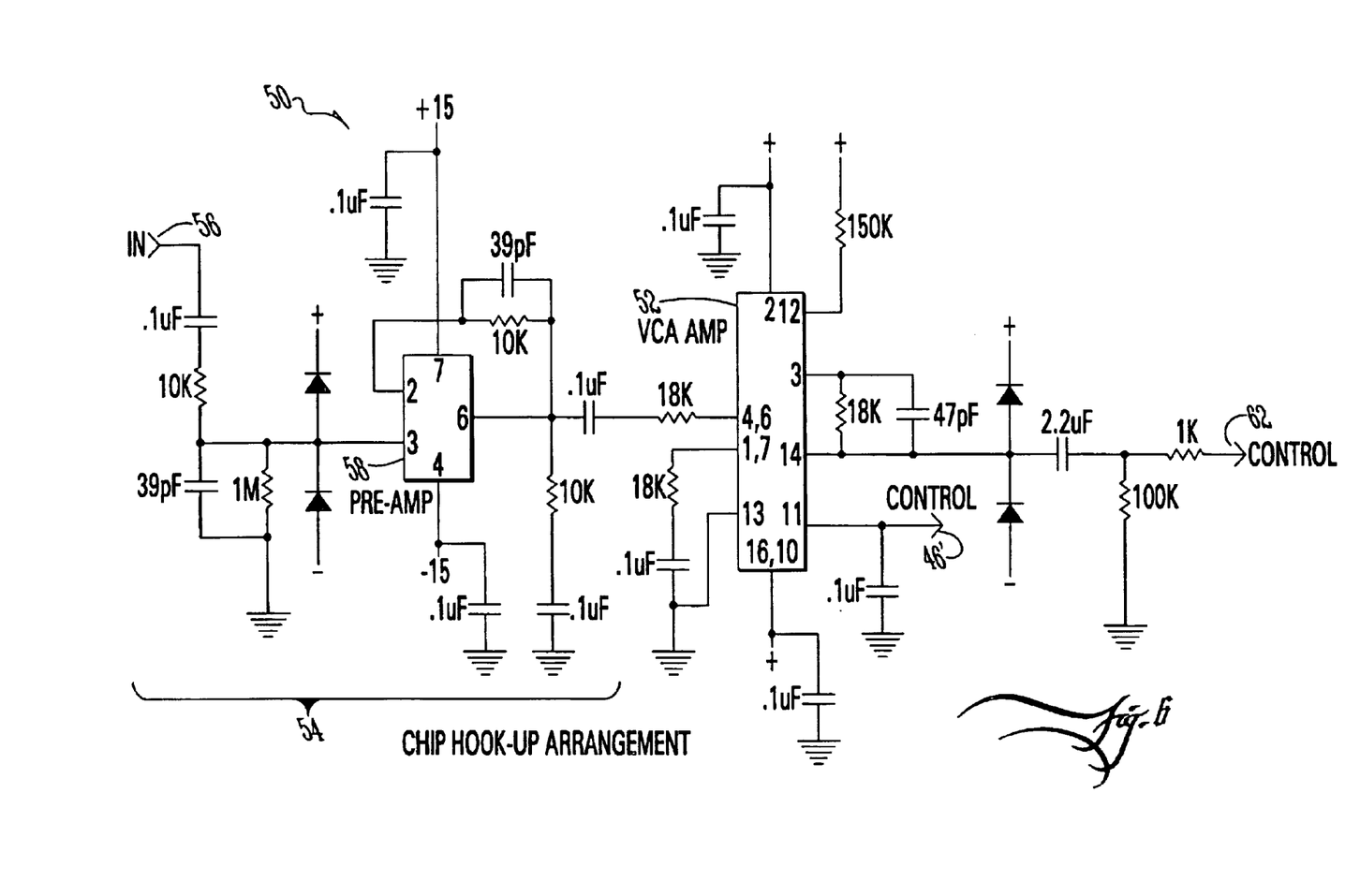
FIG. 6 is a schematic circuit diagram of an amplifier circuit for the volume control pedal in accordance with the invention.

FIG. 6 shows aspects of the example amplifier circuitry 50 in accordance with the invention. The infeed audio signal 56 is obtained from a suitable jack and is supplied to a pre-amp circuit 54. The pre-amp circuit 54 provides the infeed audio signal 56 with a high impedance in order to preserve the premium quality of the high end frequency range of the audio infeed signal 56. The infeed audio signal 56 can be either of music level or line level. A music level signal typically measures in the millivolts whereas a line level signal typically measures about a volt. The pre-amp circuit 54 provides filters for the infeed audio signal 56 before supplying it to an eight-pin operational amplifier 58 that performs the pre-amp functions. A suitable audio pre-amp chip 58 might be Burr Brown's OPA 604. From the pre-amp chip 58, the infeed signal 56 is fed into the sixteen-pin "voltage-controlled-amplifier" chip 52 (eg., in the drawings, "VCA Amp"). A suitable voltage-controlled-amplifier chip 52 might be an Analog Devices SSM2018T. The strength of the amp chip 52's output audio signal 62 is controlled by the control signal system 40 shown by and described above in connection with FIG. 1.

FIG. 7a shows a power supply circuit 70 for the volume control pedal 20 in accordance with the invention. The power infeed preferably comes by and through an adapter that plugs into a public utility 120 VAC supply and discharges a feed of low voltage DC. It is this low voltage DC that is brought into the pedal. The power feed comes into the power supply circuit and first encounters a bridge rectifier, a voltage regulator, filter capacitors, and then ultimately to a DC-to-DC converter. The output of the DC-to-DC converter is a dual polarity DC supply having a positive, a negative and a common. The dual polarity output is then processed through filter capacitors and current-limiting resistors, after which it is available for powering the other circuit devices of the invention. FIG. 7b shows an alternative power supply circuit 70' for the volume control pedal 20 in accordance with the invention. Conditioning the DC power supply to output at consistent values is significant for the emitter or light source 34. It is an aspect of the invention that the emitter 34 shines with constant emission power so that variations sensed in the received signal strength 38' are properly taken as control variations induced by the relative displacement of the shade 40, and not external noise or excursions in the 120 VAC feed.

Figure 8:
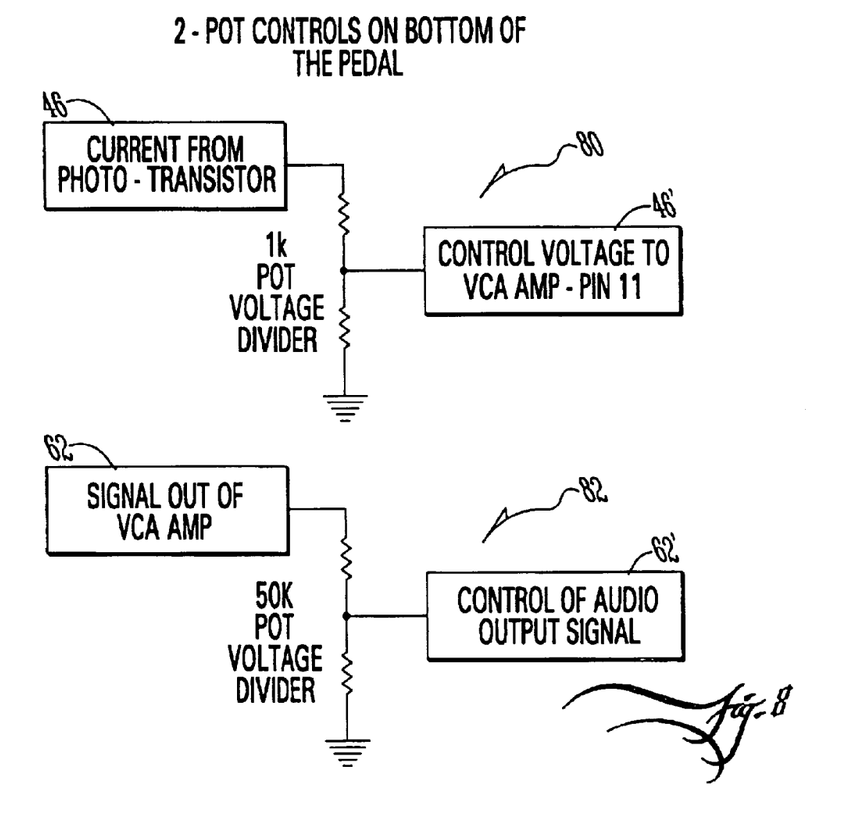

FIG. 8 shows a pair of dial- or twist-type potentiometers 80 and 82 providing preferential settings adjustment. These potentiometers 80 and 82 can be simple, small devices which are accessed through apertures in the base 21 by a thin-bladed screw-driver or like blade (not shown). Twisting the screw-driver while the blade is inserted in a socket for it allows turning the dial of the given potentiometer 80 or 82. One potentiometer 80 provides adjustment of the control signal 46 (ie., its voltage) as situated between the phototransistor 36 and voltage-controlled-amplifier chip 52. This potentiometer 80's adjustment allows setting the ON/OFF transition point of the audio output signal 62 of the voltage-controlled-amplifier chip 52. In other words, this allows the user to establish at what relative angle between the treadle 22 and base 21 constitutes the ON/OFF transition point (eg., the angle where the audio output signal 62 is perceptibly ON if treadle 22 moved out of the OFF range and thus into the ON range, or correspondingly the same angle where the audio output signal 62 is perceptibly OFF if treadle moved back from the ON range and hence back into the OFF range).

This potentiometer 80 allows the user to set up the volume control foot pedal 20 in a way the user finds comfortable. That is, a user may find that his or her foot rests most naturally on the treadle 22 at a given angle. This potentiometer 80's adjustment allows the user to establish the ON/OFF transition angle of the treadle 22 to become either that given angle or some other angle measured from that given angle, all according to that user's own personal preference.

The other potentiometer 82 provides adjustment of the audio output signal 62 between the voltage-controlled-amplifier chip 52 and the line-out jack(s) (eg., there normally are plural or multiple line-out jacks). A user may choose to have the full output strength given by the pedal 20 to be quieter or louder under different circumstances. Hence prior to a given instance of use, a user can diminish the relative loudness of the extreme loudest output of the pedal 20. The user does this by the second potentiometer 82.

Figure 5:
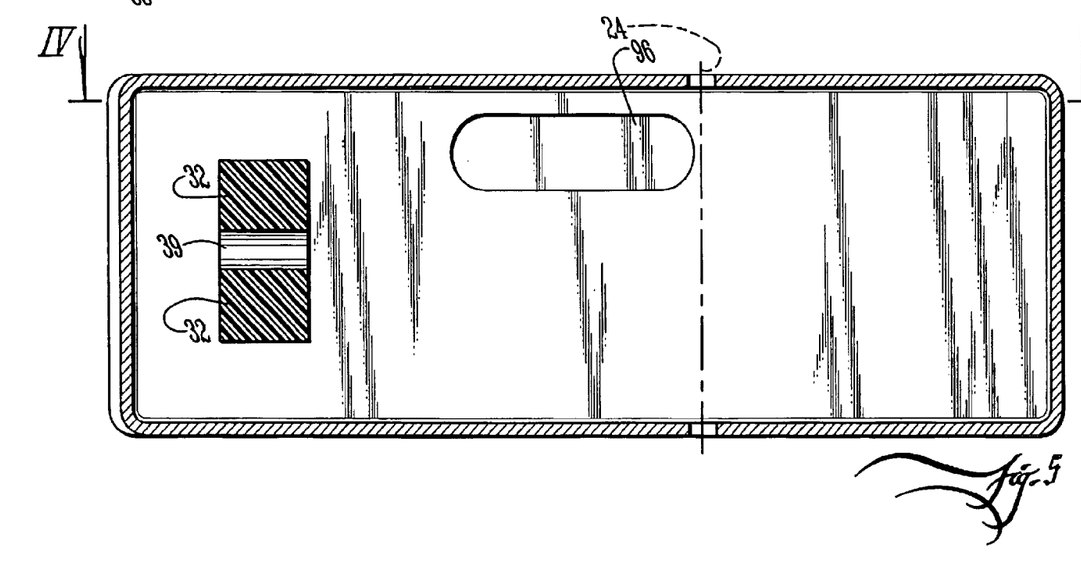
FIG. 5 is a bottom plan sectional view thereof taken in the direction of arrows V—V in FIG. 4.

Other aspects of the pedal 20 are shown by FIGS. 2 and 5. Unlike the prior art pedals, especially the ones using pulley-spun dial-type potentiometers, the shade 42 does not physically rub anything and hence its operation is drag-free. In spite of that, it is desirable nonetheless to introduce drag or inertia into the rocking of the treadle 22 so that the treadle 22 more stably holds itself in position. It is desirable if a user is required to apply light foot pressure in order to break the inertia or frictional "sticking" of the treadle 22 at rest, such that when the treadle 22 is brought to stop a successive time, the treadle 22 once again tends to stick or "freeze" there in that successive position. To achieve the foregoing, the base 21 is configured to prop up a counter-acting rocking cam 90 that is biased by a spring 92. The cam 90 is produced from a slick plastic such as an oil-impregnated nylon or PET and the like. The cam 90's arcuate cam edge 94 contacts the treadle 22 on a machined-smooth slideway 96 recessed in the web of the treadle 22 as shown in FIG. 5.

Various advantages of the invention include the following. The control signal system 40 in accordance with the invention (see, eg., FIG. 1) provides musicians with distinctively different effects than are gotten by conventional electric-conductor type potentiometers. Whereas the deciding merits of which sounds better is certainly subjective, the invention is distinctive, and its distinctiveness is winning admirers. The operating principle behind this distinctive performance is not truly known. It may be due in part to the smooth transitions in the grey scale gradations given by the computer-imaged shade 42.

Also, since the shade 42 is easily produced by computer imaging, the shade 42 can be produced in a multitude of variations which are yet highly reproducible in order to allow economical realization of any infinite number of volume control schemes 43–44. Moreover, any given shade 42 allows removal and replacement with any other shade in order to provide the user with different effects than what was gotten by the previous shade 42.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

I claim:

1. A volume control pedal comprising:
   a base supporting a pedal;
   an opposed emitter and receiver establishing an emission path therebetween and mounted relative to either the base or pedal; and
   a shade intersecting the emission path and mounted relative to the other of the base or pedal such that pedal operation induces relative displacement between the shade and emission path, wherein the shade has a varying regions of light and dark obtained by an image of a varying dot density pattern whereby relative displacement of the shade and emission path varies emission reception such that the receiver's output provides a control variable for volume control.

2. The volume control pedal of claim 1 wherein the receiver comprises one of a photo-transistor, photo-diode or photo-resistor and the emitter comprises a light emitting diode.

3. The volume control pedal of claim 1 wherein shade comprises a transparent film printed with the image.

4. The volume control pedal of claim 3 wherein the varying dot density pattern provides an image which during relative displacement of the shade and emission path between opposite extremes has the emission path tracing through regions varying gradually from essentially transparent to essentially opaque.

5. A method of producing a shade for a volume control pedal of the type having a base supporting a pedal, an opposed emitter and receiver establishing an emission path therebetween and mounted relative to either the base or pedal, and the shade mounted relative to the other of the base or pedal to intersect the emission path such that pedal operation induces relative displacement between the shade and emission path, wherein the shade has a varying regions of light and dark obtained by an image of a varying dot density pattern whereby relative displacement of the shade and emission path varies emission reception such that the receiver's output provides a control variable for volume control; said method comprising the steps of:
producing the image from a computer-implemented process; and
printing transparent stock with the image to obtain said shade.

6. The method of claim 5 wherein the transparent stock comprises a polyester-based negative film.

7. The method of claim 6 wherein the step of printing further comprises printing said transparent polyester-based negative film by a film developing process.

8. The method of claim 5 wherein the step of printing further comprises obtaining dot densities of up to 1600 dpi.

9. The method of claim 5 wherein the step of producing the image by a computer-implemented process admits defining the image by mathematical equations to obtain any multitude of variations in the image from continuous to discontinuous or linear to non-linear variations including logarithmic variations.

10. A method of producing a shade for intersecting a light axis in the circuitry of a volume control pedal of the type in which proportionate shading of the light intensity obtains a control variable for volume control; said method comprising the steps of:
generating an image for the shade by a computer-implemented process;
printing transparent stock with the image as rendered in varying dot densities, the result of which thereby operates as the shade.

11. The method of claim 10 wherein the transparent stock comprises a polyester-based negative film and the step of printing comprises a film developing process.

12. The method of claim 10 wherein the step of producing the image by a computer-implemented process admits defining the image by mathematical equations to obtain any multitude of variations in the image from continuous to discontinuous or linear to non-linear variations including logarithmic variations.

13. A drag mechanism for a treadle-style volume control pedal of the type having a treadle and a base carrying the treadle on a first rocking axis, said mechanism comprising:
a rocker having first and second arms extending from a pivot point pivoted to one of the base or treadle for rocking about a spaced second rocking axis; and,
a spring which extends between an attachment to the first arm and another attachment to the one of the base or the treadle;
wherein the second arm abuts against the other of the base or treadle for sliding contact such that rocking the treadle through various angles induces rocking in the rocker in opposition to the bias of the spring whereby the arrangement of the spring and rocker provide an opposing balancing force to the treadle for propping the treadle in place and thus preserve a relative angle of repose between the treadle and base after a user's foot is taken off the treadle.

14. The mechanism of claim 13 wherein the second arm is formed with a cam surface for the sliding contact against the other of the base or treadle.

15. A volume control pedal of the type having a shade for intersecting a light axis in the circuitry of said volume control pedal in which proportionate shading of the light intensity obtains a control variable for volume control, comprising the mechanism of claim 13.

16. A volume control pedal comprising:
a stationary base supporting a pedal;
an emitter;
a receiver for the emitter's emissions; and
a filter for filtering the emissions received by the receiver;
wherein the filter, emitter and receiver are mounted such that operation of the pedal induces relative displacement between either the emitter and the filter or the filter and the receiver;
wherein the filter has a varying regions of light and dark obtained by an image of a varying dot density pattern whereby pedal operation varies reception of the emissions such that the receiver's output provides a control variable for volume control.

17. The volume control pedal of claim 16 wherein filter either does not fold or does fold the emissions received by the receiver.

18. The volume control pedal of claim 16 wherein the receiver comprises one of a photo-transistor, photo-diode or photo-resistor.

19. The volume control pedal of claim 16 wherein filter comprises transparent stock printed with the image.

20. The volume control pedal of claim 16 wherein the varying dot density pattern provides an image which during pedal operation between opposite extremes has the received emissions varying gradually from essentially undiminished intensity to essentially zero intensity.

* * * * *